United States Patent
Tu et al.

(10) Patent No.: US 7,924,087 B2
(45) Date of Patent: Apr. 12, 2011

(54) REFERENCE BUFFER CIRCUIT

(75) Inventors: Wei-Hsuan Tu, Hsinchu (TW);
Tzung-Hung Kang, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 219 days.

(21) Appl. No.: 12/123,550

(22) Filed: May 20, 2008

(65) Prior Publication Data
US 2009/0289614 A1   Nov. 26, 2009

(51) Int. Cl.
*G05F 1/10* (2006.01)
(52) U.S. Cl. .................................. 327/537; 327/543
(58) Field of Classification Search .............. 327/538, 327/543, 534, 535, 537
See application file for complete search history.

(56) References Cited

U.S. PATENT DOCUMENTS

| | | | | |
|---|---|---|---|---|
| 5,552,723 A | * | 9/1996 | Shigehara et al. | 326/86 |
| 5,821,769 A | * | 10/1998 | Douseki | 326/34 |
| 6,304,110 B1 | * | 10/2001 | Hirano | 327/108 |
| 6,677,803 B1 | * | 1/2004 | Chiba | 327/534 |
| 6,833,749 B2 | * | 12/2004 | Erstad | 327/534 |
| 6,885,234 B2 | * | 4/2005 | Ando | 327/534 |
| 7,164,307 B2 | * | 1/2007 | Tschanz et al. | 327/534 |
| 2007/0090860 A1 | | 4/2007 | Hsu | |

FOREIGN PATENT DOCUMENTS

CN   1267406   9/2000

OTHER PUBLICATIONS

English language translation of abstract of CN 1267406 (published Sep. 20, 2000).

* cited by examiner

*Primary Examiner* — Hai L Nguyen
(74) *Attorney, Agent, or Firm* — Thomas | Kayden

(57) ABSTRACT

A reference buffer circuit with high driving capability is disclosed. In which, a buffering stage has a first NMOS transistor and a first PMOS transistor to provide high and low tracking voltages respectively based on a high input voltage and a low input voltage. A first driving stage is driven by the high and low tracking voltages to output a first high output voltage and a first low output voltage. A body of the first PMOS transistor is tied to a first bias voltage lower than a supply voltage for the buffering and first driving stages.

24 Claims, 5 Drawing Sheets

US 7,924,087 B2

REFERENCE BUFFER CIRCUIT

BACKGROUND OF THE INVENTION

1. Field of the Invention

The invention relates to reference buffer circuits, and in particular, to an improved reference buffer circuit with high driving capability.

2. Description of the Related Art

In analog circuit applications, particularly for analog to digital converters (ADCS) such as pipeline ADC, Flash ADC, and SAR ADC, a reference buffer circuit with sufficient driving capability is essential for providing accurate reference voltages. As technology advances, the supply voltage designed for circuit is lower than ever, therefore making it more of a challenge to implement a reference buffer circuit with such low supply voltage while not decreasing its driving capability.

FIG. 1 shows a conventional reference buffer circuit 100. The reference buffer circuit 100 comprises a buffering stage 110 and a driving stage 120 supplied by a supply voltage $V_{DD}$. The buffering stage 110 provides a high tracking voltage $V_{GH}$ and a low tracking voltage $V_{GL}$ respectively based on a high input voltage $V_{inH}$ and a low input voltage $V_{inL}$, and the driving stage 120 is driven by the high tracking voltage $V_{GH}$ and the low tracking voltage $V_{GL}$ to output a high output voltage $V_{outH}$ and a low output voltage $V_{outL}$. Specifically, the buffering stage 110 comprises a first NMOS transistor M1 with its drain coupled to the supply voltage $V_{DD}$, and a first PMOS transistor M2 with its drain coupled to the signal ground. A first operational amplifier OP1 has two input ends and one output end. The first input end (+) is for receiving the high input voltage $V_{inH}$, the second input end (−) is coupled to the source of the first NMOS transistor M1, and the output end is coupled to the gate of the first NMOS transistor M1. The second operational amplifier OP2 has similar deployment as that of the first operational amplifier OP1. The first input end (+) of the second operational amplifier OP2 is for receiving the low input voltage $V_{inL}$, the second input end (−) is coupled to the source of the first PMOS transistor M2, and the output end is coupled to the gate of the first PMOS transistor M2. A buffering stage resistor $R_B$ is coupled between the sources of the first NMOS transistor M1 and the first PMOS transistor M2. By applying the high input voltage $V_{inH}$ to the first operational amplifier OP1, the first operational amplifier OP1 locks the gate voltage of the first NMOS transistor M1 at a high tracking voltage $V_{GH}$. Likewise, the second operational amplifier OP2 locks the gate voltage of the first PMOS transistor M2 at a low tracking voltage $V_{GL}$ according to the low input voltage $V_{inL}$. Thereby, the driving stage 120 is driven by the high tracking voltage $V_{GH}$ and low tracking voltage $V_{GL}$ to accurately output the high output voltage $V_{outH}$ and low output voltage $V_{outL}$.

Specifically, the driving stage 120 comprises two MOS transistors and a resistor. A second NMOS transistor M3 has a drain coupled to the supply voltage $V_{DD}$, a gate for receiving the high tracking voltage $V_{GH}$, and a source for outputting the high output voltage $V_{outH}$. A second PMOS transistor M4 has a drain coupled to the signal ground, a gate receiving the low tracking voltage $V_{GL}$, and a source for outputting the low output voltage $V_{outL}$. A driving stage resistor $R_D$ is coupled between the sources of the second NMOS transistor M3 and the second PMOS transistor M4. The driving stage 120 is also referred to as a replica circuit, in which the high output voltage $V_{outH}$ and low output voltage $V_{outL}$ are used as reference voltages that are provided with high driving capability.

With design criteria requiring the supply voltage to be reduced, the low output voltage $V_{outL}$ also drops. The low output voltage $V_{outL}$ is likely to be lower than the gate-to-source voltage drop of the second PMOS transistor M4, causing the total driving stage 120 to stop functioning, because the second PMOS transistor M4 would be turned off. Hence, an enhanced circuit structure is desirable which overcomes the issue.

BRIEF SUMMARY OF THE INVENTION

An exemplary embodiment of a reference buffer circuit is provided. The reference buffer circuit has a buffering stage and a first driving stage. The buffering stage is for providing a high tracking voltage and a low tracking voltage respectively based on a high input voltage and a low input voltage. The first driving stage is driven by the high tracking voltage and the low tracking voltage to output a first high output voltage and a first low output voltage.

The buffering stage has a first NMOS transistor, a first operational amplifier, a first PMOS transistor and a second operational amplifier. A drain of the first NMOS transistor is coupled to a supply voltage. The first operational amplifier has a first input end for receiving the high input voltage, a second input end coupled to a source of the first NMOS transistor, and an output end coupled to a gate of the first NMOS transistor for outputting the high tracking voltage. A drain of the first PMOS transistor is coupled to a signal ground. The second operational amplifier has a first input end for receiving the low input voltage, a second input end coupled to a source of the first PMOS transistor, and an output end coupled to a gate of the first PMOS transistor for outputting the low tracking voltage. A body of the first PMOS transistor is tied to a first bias voltage lower than the supply voltage.

Another exemplary embodiment of a reference buffer circuit is provided. The reference buffer circuit has a buffering stage and a first driving stage. The buffering stage has a first NMOS transistor and a first PMOS transistor for providing a high tracking voltage and a low tracking voltage respectively based on a high input voltage and a low input voltage. The first driving stage has a second NMOS transistor and a second PMOS transistor respectively driven by the high tracking voltage and the low tracking voltage to output a first high output voltage and a first low output voltage. In the embodiment, a body of the first PMOS transistor is tied to a first bias voltage lower than a supply voltage for the buffering and first driving stages.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
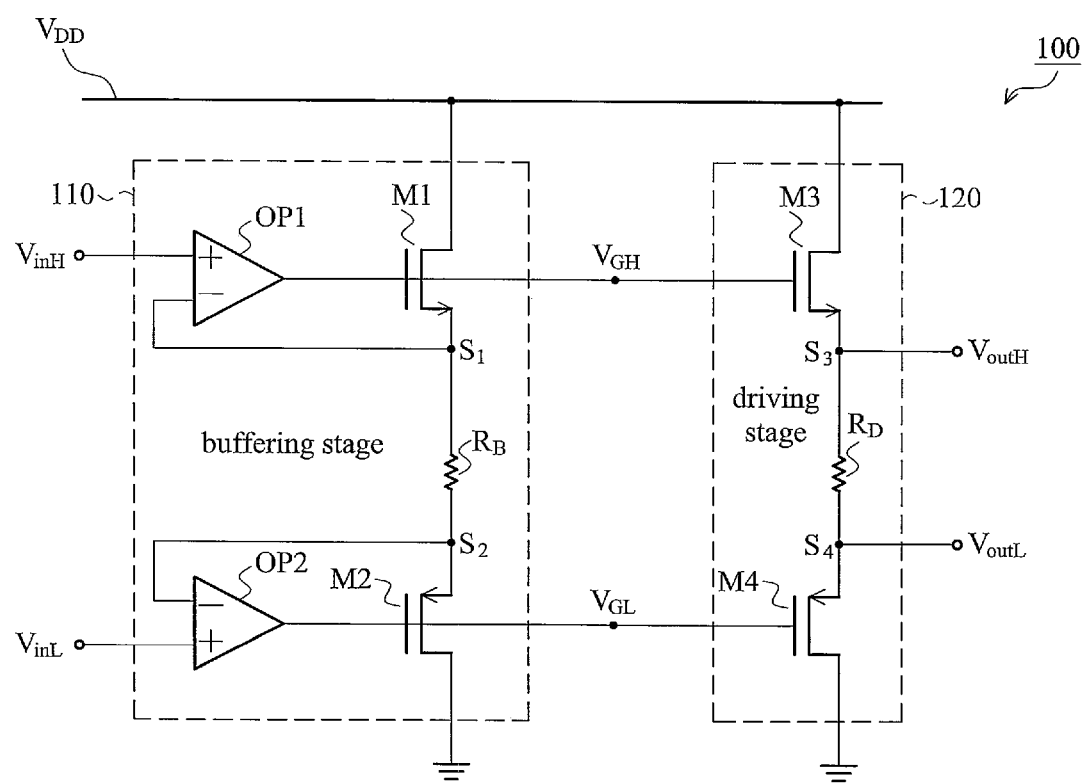
FIG. 1 shows a conventional reference buffer circuit 100.
Figure 2A:
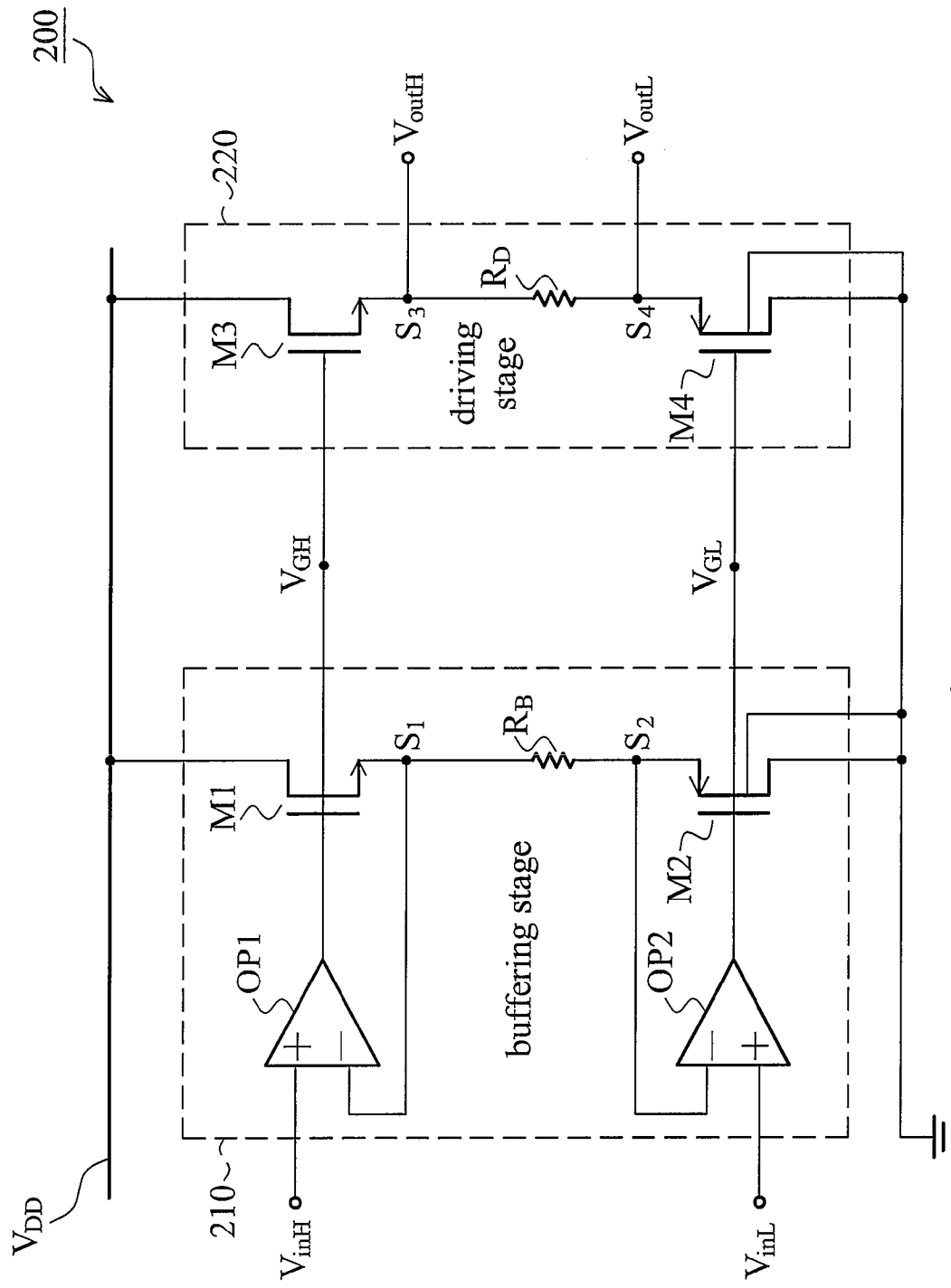
FIGS. 2a and 2b show reference buffer circuits according to embodiments of the invention.

FIG. 2a shows a reference buffer circuit 200 according to an embodiment of the invention. In the reference buffer circuit 200, the first PMOS transistor M2 and second PMOS transistor M4 are modified to adapt for low supply voltage use. The reference buffer circuit 200 comprises a buffering stage 210 and a driving stage 220. The buffering stage 210 provides a high tracking voltage $V_{GH}$ and a low tracking voltage $V_{GL}$ respectively based on a high input voltage $V_{inH}$ and a low input voltage $V_{inL}$, and the driving stage 220 is driven by the high tracking voltage $V_{GH}$ and the low tracking voltage $V_{GL}$ to output a high output voltage $V_{outH}$ and a low output voltage $V_{outL}$.

In the buffering stage 210, the first NMOS transistor M1's drain is coupled to the supply voltage $V_{DD}$. The first input end (+) of the first operational amplifier OP1 receives the high input voltage $V_{inH}$, the second input end (−) is connected to the source of the first NMOS transistor M1, and the output end is connected to the gate of the first NMOS transistor M1. The first PMOS transistor M2's drain is connected to a signal ground. The first input end (+) of the second operational amplifier OP2 is bound by the low input voltage $V_{inL}$, the second input end (−) is connected to the source of the first PMOS transistor M2, and the output end is coupled to the gate of the first PMOS transistor M2. Furthermore, a buffering stage resistor $R_B$ is coupled between the sources of the first NMOS transistor M1 and the first PMOS transistor M2. In the embodiment, a body of the first PMOS transistor M2 may be biased by a bias voltage lower than the supply voltage $V_{DD}$. For example, if the body of the first PMOS transistor M2 is tied to the signal ground, the threshold voltage of the first PMOS transistor M2 can thereby be subsequently reduced by 150 mV. In another embodiment, the body of the first PMOS transistor M2 can be biased by another bias voltage, which is lower than the source voltage of the first PMOS transistor M2, referring to so-called forward body bias. By such configuration, the first PMOS transistor M2 can remain operative instead of being turned off when the supply voltage $V_{DD}$ for it is lower than ever.

In the driving stage 220, a second NMOS transistor M3 has a drain connected to the supply voltage $V_{DD}$, a gate for receiving the high tracking voltage $V_{GH}$, and a source for outputting the high output voltage $V_{outH}$. A second PMOS transistor M4 has a drain connected to the signal ground, a gate for receiving the low tracking voltage $V_{GL}$, and a source for outputting the low output voltage $V_{outL}$. A driving stage resistor $R_D$ is disposed between the sources of the second NMOS transistor M3 and the second PMOS transistor M4. Like the first PMOS transistor M2, a body of the second PMOS transistor M4 is tied to a bias voltage lower than the supply voltage $V_{DD}$, such as the signal ground. The widths of the second NMOS transistor M3 and second PMOS transistor M4 may be m times larger than the widths of the first NMOS transistor M1 and first PMOS transistor M2, and the driving stage resistor $R_D$ is 1/m times the buffering stage resistor $R_B$. Consequently, the currents flowing through the driving stage 220 is m times larger than that of the buffering stage 210, which means the driving capability of the driving stage 220 is also multiplied by m.

More particularly, in the embodiment, the drains of the first NMOS transistor M1 and the second NMOS transistor M3 are both coupled to the same supply voltage $V_{DD}$. However, in order to increase power supply rejection ratio (PSRR), for example, NMOS transistors may be used to cascode with the drain of either the first NMOS transistor M1 or the second NMOS transistor M3. That is, the supply voltages coupled to the drains of the first NMOS transistor M1 and the second NMOS transistor M3 may be different due to the cascoded transistor. One drain of the two NMOS transistors M1 and M3 is coupled to a first supply voltage, and the other drain of them is coupled to a second supply voltage.

For example, the first PMOS transistor M2 and second PMOS transistor M4 with forward body bias are theoretically equivalent to forming a PN junction between source and body of threshold voltage 0.6V or 0.7V When the second NMOS transistor M3 and the second PMOS transistor M4 are turned on to sink the currents from the supply voltage $V_{DD}$ to the signal ground, the low output voltage $V_{outL}$ is initially at a higher level that may be capable of turning on the equivalent PN junction. The current sinking rate is therefore further accelerated when the equivalent PN junction is turned on, such that the low output voltage $V_{outL}$ is converged to a desired level more rapidly. When the low output voltage $V_{outL}$ approaches the desired level, the equivalent PN junction is gradually turned off, and eventually, only the second PMOS transistor M4 remains active to sink the current. In other words, the circuit structure features high reliability, rapid convergence rate, and high driving capability.

In one example, if the first operational amplifier OP1 and second operational amplifier OP2 are designed to be operated at 1.2V, the first NMOS transistor M1, first PMOS transistor M2, second NMOS transistor M3 and second PMOS transistor M4 can be implemented by native MOS transistors, of which the threshold voltages are small. In another example, if the first operational amplifier OP1 and second operational amplifier OP2 are designed to be operated at 3.3V, the first NMOS transistor M1, first PMOS transistor M2, second NMOS transistor M3 and second PMOS transistor M4 may be implemented by ordinary MOS transistors.

Figure 2B:
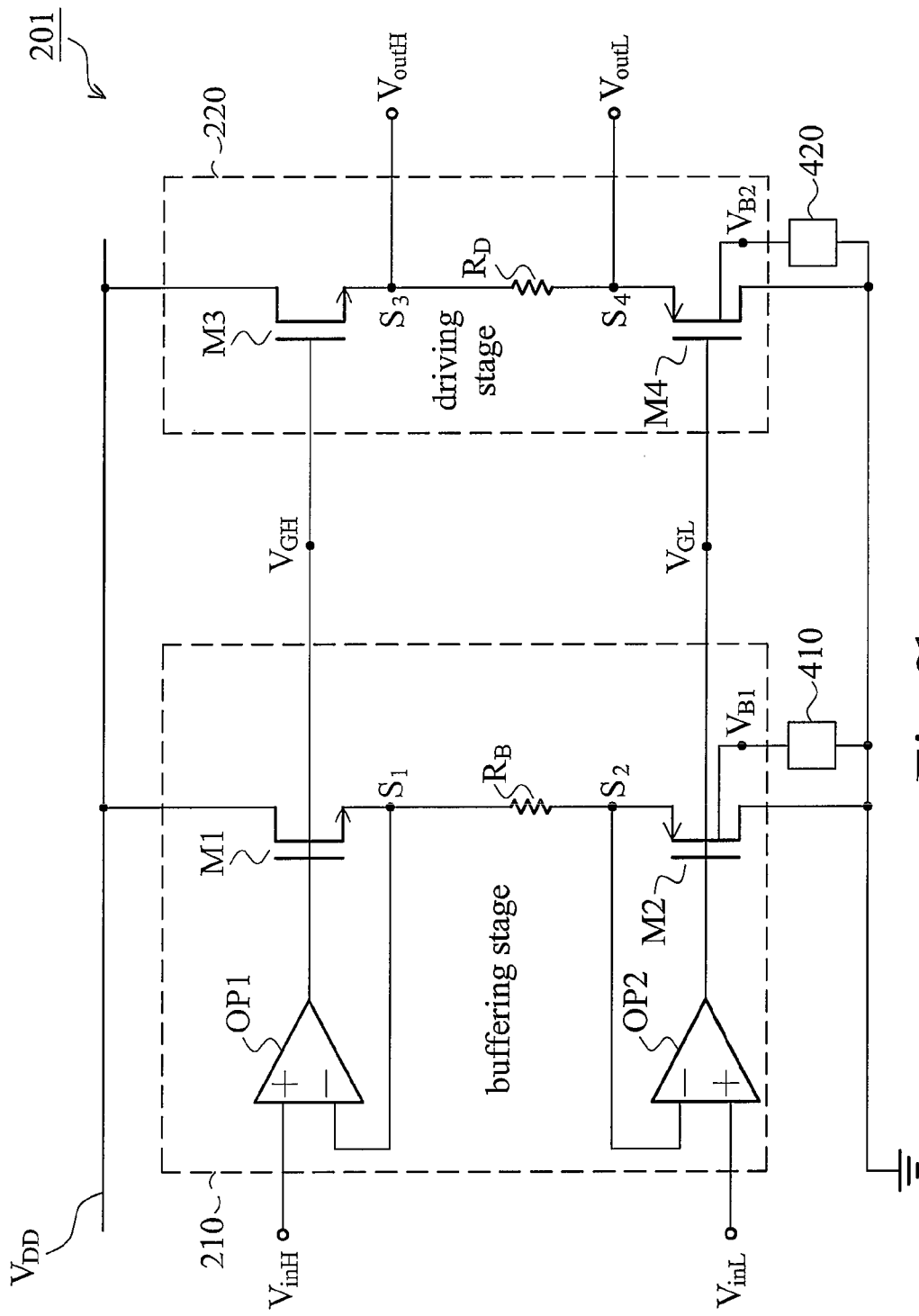

FIG. 2b shows another embodiment of a reference buffer circuit 201. The reference buffer circuit 201 is similar to the reference buffer circuit 200 in FIG. 2a, however, a first bias voltage generator 410 and a second bias voltage generator 420 are provided to generate a first bias voltage $V_{B1}$ and a second bias voltage $V_{B2}$. The bodies of first PMOS transistor M2 and second PMOS transistor M4 are respectively biased by the first bias voltage $V_{B1}$ and the second bias voltage $V_{B2}$. In the embodiment, the first PMOS transistor M2 has its body tied to the first bias voltage generator 410. The first bias voltage $V_{B1}$ provided by the first bias voltage generator 410 is adjustable from lower than the supply voltage $V_{DD}$ to the signal ground. Therefore, when a low-voltage supply voltage $V_{DD}$ is applied, the first PMOS transistor M2 can remain operative rather than inactive.

In the driving stage 220, the second PMOS transistor M4 has its body tied to the second bias voltage generator 420. The second bias voltage $V_{B2}$ provided by the second bias voltage generator 420 is adjustable from lower than the supply voltage $V_{DD}$ to the signal ground.

Figure 3A:
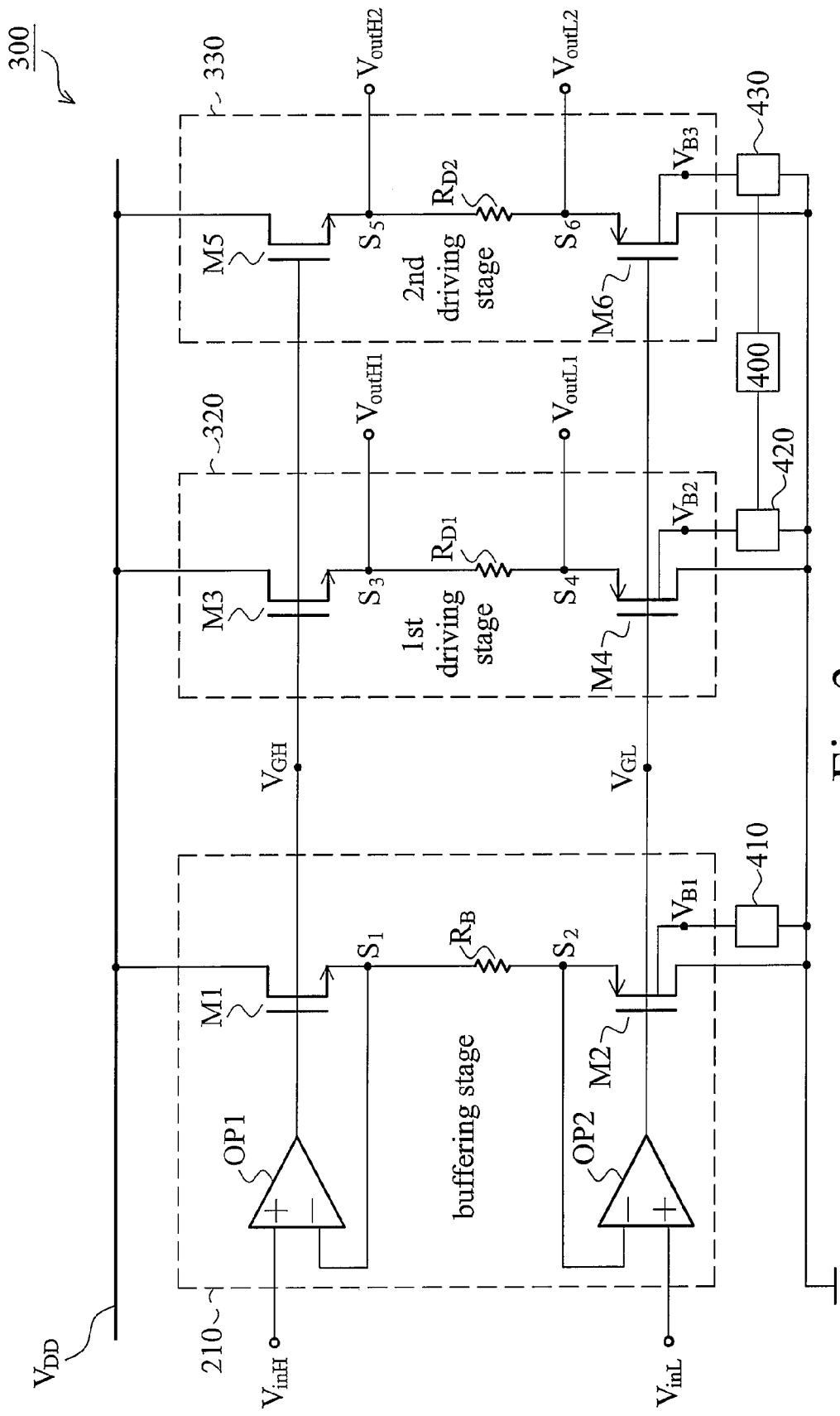
FIGS. 3a and 3b show reference buffer circuits according to other embodiments of the invention.

FIG. 3a shows a reference buffer circuit 300 according to another embodiment of the invention. Compared to the reference buffer circuit 200 as illustrated above, the reference buffer circuit 300 comprises more than one driving stage, which is particularly adaptable for a time interleaving structure such as a pipeline ADC. In the reference buffer circuit 300, a first driving stage 320 is driven by the high tracking voltage $V_{GH}$ and the low tracking voltage $V_{GL}$ to output a first high output voltage $V_{outH1}$ and a first low output voltage $V_{outL1}$, and simultaneously, a second driving stage 330 is driven by the high tracking voltage $V_{GH}$ and the low tracking voltage $V_{GL}$ to output a second high output voltage $V_{outH2}$ and a second low output voltage $V_{outL2}$. The first driving stage 320 is basically identical to the driving stage 220 in FIG. 2b, in which the M4 is body biased by a second bias voltage generator 420. The structure of the second driving stage 330 is similar to the first driving stage 320, comprising a third bias voltage generator 430 to generate a third bias voltage $V_{B3}$.

In the second driving stage 330, a third NMOS transistor M5 has a drain coupled to the supply voltage $V_{DD}$, a gate for receiving the high tracking voltage $V_{GH}$, and a source for outputting the second high output voltage $V_{outH2}$. A third PMOS transistor M6 has a drain coupled to the signal ground, a gate for receiving the low tracking voltage $V_{GL}$, and a source for outputting the second low output voltage $V_{outL2}$. A second driving stage resistor $R_{D2}$ is coupled between the sources of the third NMOS transistor M5 and third PMOS transistor M6 for providing a voltage drop.

The body of the third PMOS transistor M6 is biased by the third bias voltage generator 430. The third bias voltage $V_{B3}$ generated by the third bias voltage generator 430 is adjustable from lower than the supply voltage $V_{DD}$ to the signal ground. Although the NMOS transistors and PMOS transistors in the first driving stage 320 and second driving stage 330 are intentionally made identical, component mismatches may still unavoidably occur, consequently inducing an ADC gain error. A compensation unit 400 is thus provided in this embodiment, having two ends respectively connected to the second bias voltage generator 420 and the third bias voltage generator 430. The compensation unit 400 is arranged to modify the second bias voltage $V_{B2}$ or the third bias voltage $V_{B3}$ according to a first voltage difference between the first high output voltage $V_{outH1}$ and the first low output voltage $V_{outL1}$ and a second voltage difference between the second high output voltage $V_{outH2}$ and the second low output voltage $V_{outL2}$. The second bias voltage generator 420 and third bias voltage generator 430 may be implemented by adjustable resistors, and the compensation unit 400 can adjust the adjustable resistors to compensate the mismatch. For example, if the first voltage difference is not in accordance with the second voltage difference, the second low output voltage $V_{outL2}$ can be increased or decreased by adjusting the third bias voltage $V_{B3}$ through the third bias voltage generator 430. In addition, the second bias voltage generator 420 and third bias voltage generator 430 may also be adjustable voltage sources that provide the same functionality.

Like the embodiments in FIGS. 2a and 2b, the first operational amplifier OP1 and second operational amplifier OP2 as shown in FIG. 3a may be operated at 1.2V or 3.3V If the first operational amplifier OP1 and the second operational amplifier OP2 are operated at 1.2V, the NMOS transistors and PMOS transistors can be implemented by native MOS transistors. Otherwise, ordinary MOS transistors can be used while the first operational amplifier OP1 and the second operational amplifier OP2 are operated at 3.3V.

Figure 3B:
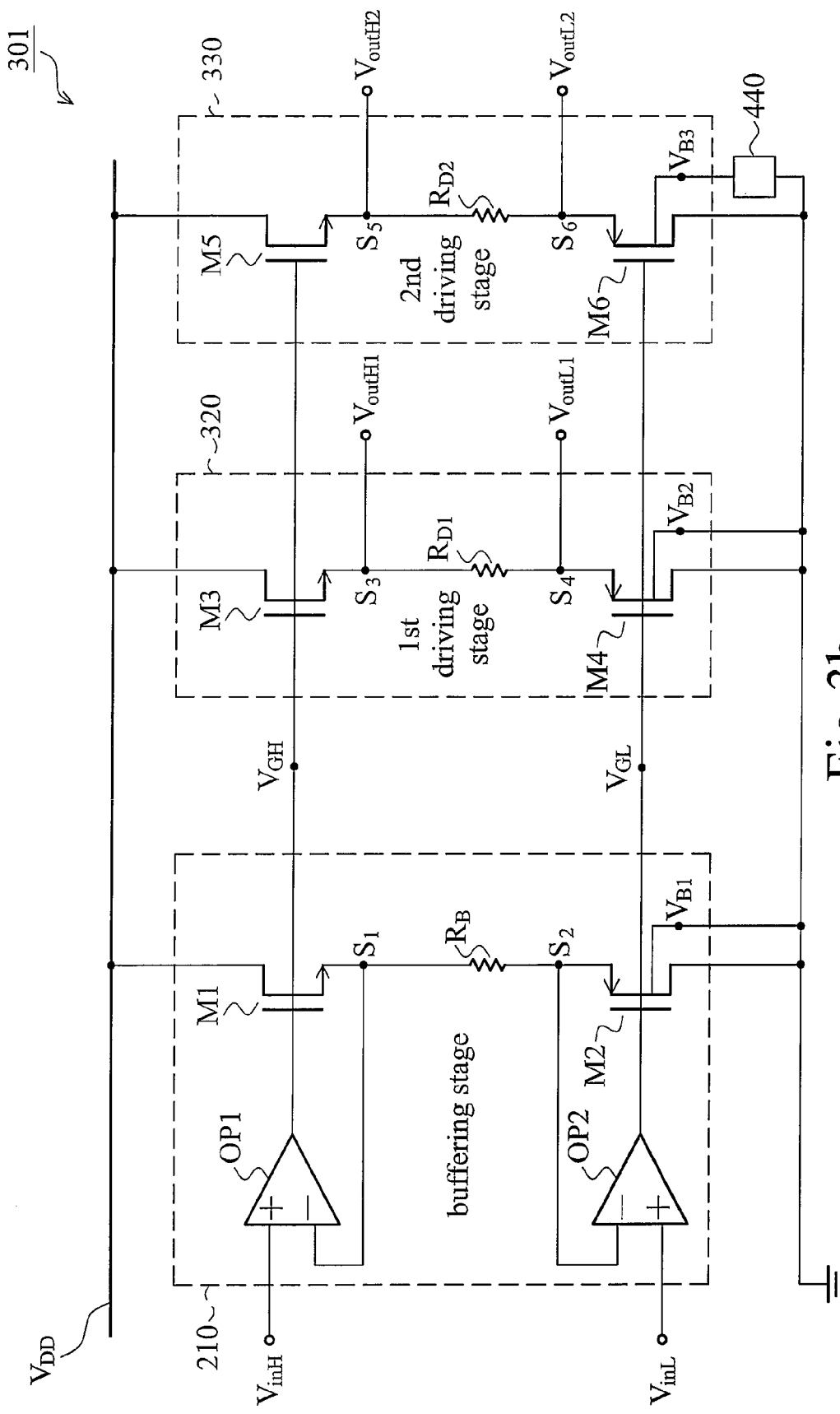

FIG. 3b shows a reference buffer circuit 301 according to another embodiment of the invention. The reference buffer circuit 301 is a special case of the embodiment of FIG. 3a, in which the first bias voltage $V_{B1}$ and second bias voltage $V_{B2}$ are tied to the signal ground. A compensation unit 440 is implemented on the body of the third PMOS transistor M6 to provide the third bias voltage $V_{B3}$ which is adjustable to compensate the mismatch between the first driving stage 320 and the second driving stage 330. While the invention has been described by way of various body biased examples and in terms of preferred embodiment, it is to be understood that the invention is not limited to FIGS. 2a, 2b, 3a and 3b. To the contrary, it is intended to cover various modifications and similar arrangements (as would be apparent to those skilled in the art) in which the bodies of the first, second and third transistors M2, M4 and M6 are biased. Therefore, the scope of the appended claims should be accorded the broadest interpretation so as to encompass all such modifications and similar arrangements.

What is claimed is:
1. A reference buffer circuit, comprising:
a buffering stage, coupled to a first supply voltage and providing a high tracking voltage and a low tracking voltage respectively based on a high input voltage and a low input voltage;
a first driving stage, coupled to a second supply voltage and driven by the high tracking voltage and the low tracking voltage to output a first high output voltage and a first low output voltage;
a second driving stage, coupled to a third supply voltage and driven by the high tracking voltage and the low tracking voltage to output a second high output voltage and a second low output voltage; and
a compensation unit,
wherein the buffering stage comprises:
a first NMOS transistor with its drain coupled to the first supply voltage;
a first operational amplifier, having a first input end for receiving the high input voltage, a second input end coupled to a source of the first NMOS transistor, and an output end coupled to a gate of the first NMOS transistor for outputting the high tracking voltage;
a first PMOS transistor with its drain coupled to a signal ground; and
a second operational amplifier, having a first input end for receiving the low input voltage, a second input end coupled to a source of the first PMOS transistor, and an output end coupled to a gate of the first PMOS transistor for outputting the low tracking voltage;
wherein a body of the first PMOS transistor is tied to a first bias voltage lower than the first supply voltage, and
wherein the first driving stage comprises a second PMOS transistor with a body tied to a second bias voltage lower than the second supply voltage, the second driving stage comprises a third PMOS transistor with a body tied to a third bias voltage lower than the third supply voltage, and the compensation unit calibrates mismatch between the first and second driving stages by modifying the third bias voltage.

2. The reference buffer circuit as claimed in claim 1, further comprising a bias voltage generator for providing the first bias voltage.

3. The reference buffer circuit as claimed in claim 1, wherein the first operational amplifier and the second operational amplifier are operated at 1.2V, and the first NMOS transistor and the first PMOS transistor are native MOS transistors.

4. The reference buffer circuit as claimed in claim 1, wherein the first operational amplifier and the second operational amplifier are operated at 3.3V, and the first NMOS transistor and the first PMOS transistor are ordinary MOS transistors.

5. The reference buffer circuit as claimed in claim 1, wherein the first driving stage comprises:
a second NMOS transistor, having a drain coupled to the second supply voltage, a gate for receiving the high tracking voltage, and a source for outputting the first high output voltage; and the second PMOS transistor, having a drain coupled to the signal ground, a gate for receiving the low tracking voltage, and a source for outputting the first low output voltage.

6. The reference buffer circuit as claimed in claim 1, wherein the second driving stage comprises:
   a third NMOS transistor, having a drain coupled to the third supply voltage, a gate for receiving the high tracking voltage, and a source for outputting the second high output voltage; and
   the third PMOS transistor, having a drain coupled to the signal ground, a gate for receiving the low tracking voltage, and a source for outputting the second low output voltage.

7. The reference buffer circuit as claimed in claim 1, wherein the first and second bias voltages are equal to the signal ground.

8. The reference buffer circuit as claimed in claim 1, wherein the compensation unit is arranged to modify the third bias voltage according to a first voltage difference between the first high output voltage and the first low output voltage and a second voltage difference between the second high output voltage and the second low output voltage.

9. A reference buffer circuit, comprising:
   a buffering stage, having a first NMOS transistor and a first PMOS transistor for providing a high tracking voltage and a low tracking voltage respectively based on a high input voltage and a low input voltage;
   a first driving stage, having a second NMOS transistor and a second PMOS transistor respectively driven by the high tracking voltage and the low tracking voltage to output a first high output voltage and a first low output voltage;
   a second driving stage, having a third NMOS transistor and a third PMOS transistor respectively driven by the high tracking voltage and the low tracking voltage to output a second high output voltage and a second low output voltage; and
   a compensation unit,
   wherein a body of the first PMOS transistor is tied to a first bias voltage lower than a first supply voltage for the buffering stage, a body of the second PMOS transistor is tied to a second bias voltage lower than a second supply voltage for the first driving stage, and a body of the third PMOS transistor is tied to a third bias voltage lower than a third supply voltage for the second driving stage, and
   wherein the compensation unit calibrates mismatch between the first and second driving stages by modifying the third bias voltage.

10. The reference buffer circuit as claimed in claim 9, wherein the second driving stage comprises:
    the third NMOS transistor, having a drain coupled to the third supply voltage, a gate for receiving the high tracking voltage, and a source for outputting the second high output voltage; and
    the third PMOS transistor, having a drain coupled to the signal ground, a gate for receiving the low tracking voltage, and a source for outputting the second low output voltage.

11. The reference buffer circuit as claimed in claim 9, wherein the first and second bias voltages are equal to the signal ground.

12. The reference buffer circuit as claimed in claim 9, wherein the buffering stage further comprises:
    a first operational amplifier, having a first input end for receiving the high input voltage, a second input end coupled to a source of the first NMOS transistor, and an output end coupled to a gate of the first NMOS transistor for outputting the high tracking voltage; and
    a second operational amplifier, having a first input end for receiving the low input voltage, a second input end coupled to a source of the first PMOS transistor, and an output end coupled to a gate of the first PMOS transistor for outputting the low tracking voltage;
    wherein a drain of the first NMOS transistor is coupled to the first supply voltage, and a drain of the first PMOS transistor is coupled to a signal ground.

13. The reference buffer circuit as claimed in claim 12, wherein the first operational amplifier and the second operational amplifier are operated at 1.2V, and the first NMOS transistor and the first PMOS transistor are native MOS transistors.

14. The reference buffer circuit as claimed in claim 12, wherein the first operational amplifier and the second operational amplifier are operated at 3.3V, and the first NMOS transistor and the first PMOS transistor are ordinary MOS transistors.

15. The reference buffer circuit as claimed in claim 12, wherein a drain of the second NMOS transistor is coupled to the second supply voltage, a gate of the second NMOS transistor is for receiving the high tracking voltage, and a source of the second NMOS transistor is for outputting the first high output voltage; a drain of the second PMOS transistor is coupled to the signal ground, a gate of the second PMOS transistor is for receiving the low tracking voltage, and a source of the second PMOS transistor is for outputting the first low output voltage.

16. The reference buffer circuit as claimed in claim 11, wherein the compensation unit is arranged to modify the third bias voltage according to a first voltage difference between the first high output voltage and the first low output voltage and a second voltage difference between the second high output voltage and the second low output voltage.

17. A reference buffer circuit, comprising:
    a first driving stage, having a first MOS transistor and a second MOS transistor driven by a high tracking voltage and a low tracking voltage to output a first high output voltage and a first low output voltage; and
    a second driving stage, having a third MOS transistor and a fourth MOS transistor driven by the high tracking voltage and the low tracking voltage to output a second high output voltage and a second low output voltage;
    wherein a body of the second MOS transistor is tied to a first bias voltage lower than a first supply voltage for the first driving stage, and a body of the fourth MOS transistor is tied to a second bias voltage lower than a second supply voltage for the second driving stage, and
    wherein the second bias voltage is different from the first bias voltage.

18. The reference buffer circuit as claimed in claim 17, wherein the first bias voltage is equal to the signal ground.

19. The reference buffer circuit as claimed in claim 17, further comprising:
    a compensation unit, for calibrating mismatch between the first and second driving stages by modifying the second bias voltage.

20. The reference buffer circuit as claimed in claim 19, wherein the compensation unit is arranged to modify the second bias voltage according to a first voltage difference between the first high output voltage and the first low output voltage and a second voltage difference between the second high output voltage and the second low output voltage.

21. A reference buffer circuit, comprising:
a buffering stage, having a first MOS transistor and a second MOS transistor for providing a high tracking voltage and a low tracking voltage based on a high input voltage and a low input voltage;
a first driving stage, having a third MOS transistor and a fourth MOS transistor driven by the high tracking voltage and the low tracking voltage to output a first high output voltage and a first low output voltage;
a first bias voltage generator, arranged to provide a first bias voltage; and
a second bias voltage generator, arranged to provide a second bias voltage;
wherein a body of the second MOS transistor is tied to the first bias voltage generator, a body of the fourth MOS transistor is tied to the second bias voltage generator, and the bodies of the second and fourth MOS transistors are respectively biased by the first and second bias voltages.

22. The reference buffer circuit of claim 21, wherein the first or second bias voltage provided by the first or second bias voltage generator is adjustable from lower than a supply voltage to a signal ground.

23. A reference buffer circuit, comprising:
a first driving stage, having a first MOS transistor and a second MOS transistor driven by a high tracking voltage and a low tracking voltage to output a first high output voltage and a first low output voltage;
a second driving stage, having a third MOS transistor and a fourth MOS transistor driven by the high tracking voltage and the low tracking voltage to output a second high output voltage and a second low output voltage;
a first bias voltage generator, arranged to provide a first bias voltage; and
a second bias voltage generator, arranged to provide a second bias voltage;
wherein a body of the second MOS transistor is tied to the first bias voltage generator, a body of the fourth MOS transistor is tied to the second bias voltage generator, and the bodies of the second and fourth MOS transistors are respectively biased by the first and second bias voltages.

24. The reference buffer circuit of claim 23, wherein the body of the second MOS transistor is tied to the first bias voltage lower than a first supply voltage for the first driving stage, the body of the fourth MOS transistor is tied to the second bias voltage lower than a second supply voltage for the second driving stage, and the first bias voltage generator or the second bias voltage generator is adjustable.

* * * * *